(12) United States Patent
Bae et al.

(10) Patent No.: US 11,990,322 B2
(45) Date of Patent: May 21, 2024

(54) CERAMIC SUSCEPTOR

(71) Applicant: MiCo Ceramics Ltd., Anseong-si (KR)

(72) Inventors: Haneum Bae, Anseong-si (KR);
Jusung Lee, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 0 days.

(21) Appl. No.: 18/361,958

(22) Filed: Jul. 31, 2023

(65) Prior Publication Data

US 2024/0038509 A1 Feb. 1, 2024

(30) Foreign Application Priority Data

Aug. 1, 2022 (KR) .......................... 10-2022-0095402

(51) Int. Cl.
*H01L 21/02* (2006.01)
*H01J 37/32* (2006.01)
(Continued)

(52) U.S. Cl.
CPC .. *H01J 37/32724* (2013.01); *H01J 37/32577* (2013.01); *H01L 21/68792* (2013.01);
(Continued)

(58) Field of Classification Search
CPC ...................... H01J 37/32577; H01J 37/32082
See application file for complete search history.

(56) References Cited

U.S. PATENT DOCUMENTS

| 10,692,703 B2 * | 6/2020 | Lin ................... H01J 37/32715 |
| 11,640,905 B2 * | 5/2023 | Aydin ............... H01L 21/02532 438/778 |

(Continued)

FOREIGN PATENT DOCUMENTS

| CN | 103023281 A | 4/2013 |
| CN | 110291623 A | 9/2019 |

(Continued)

OTHER PUBLICATIONS

Office Action of JPO for Japanense application No. 2023-123672, issued on Jan. 23, 2024.

(Continued)

*Primary Examiner* — Lee D Wilson
(74) *Attorney, Agent, or Firm* — NKL Law; Byungwoong Park

(57) ABSTRACT

The present disclosure relates to a ceramic susceptor. The ceramic susceptor of the present disclosure may include: an insulating plate in which a RF electrode is disposed; a shaft connected to the insulating plate at one end and comprising a separator at a remaining end; a connection mount having an upper portion connected to the remaining end of the shaft; a first rod and a second rod connected to the RF electrode and penetrating the separator to extend into the connection mount; and a connection member disposed in the connection mount and connecting the first rod and the second rod extending into the connection mount to a draw-in rod, wherein the connection member may include an elastic member configured to absorb a difference in deformation due to heat among the first rod, the second rod, and the draw-in rod.

7 Claims, 6 Drawing Sheets

(51) Int. Cl.
*H01L 21/687* (2006.01)
*C23C 16/505* (2006.01)

(52) U.S. Cl.
CPC ....... *C23C 16/505* (2013.01); *H01J 37/32082* (2013.01); *H01J 2237/002* (2013.01); *H01J 2237/24585* (2013.01); *H01J 2237/3321* (2013.01)

(56) References Cited

U.S. PATENT DOCUMENTS

| | | | |
|---|---|---|---|
| 11,699,602 B2* | 7/2023 | Li | H01L 21/68764 |
| | | | 438/795 |
| 2001/0003334 A1 | 6/2001 | Kano et al. | |
| 2003/0051665 A1 | 3/2003 | Zhao et al. | |
| 2005/0028739 A1* | 2/2005 | Natsuhara | C23C 16/4581 |
| | | | 118/728 |
| 2006/0272774 A1 | 12/2006 | Maehara et al. | |
| 2015/0126045 A1* | 5/2015 | Chatterjee | H01L 21/02222 |
| | | | 438/792 |
| 2016/0056032 A1* | 2/2016 | Baldasseroni | C23C 16/45527 |
| | | | 438/778 |
| 2021/0100072 A1 | 4/2021 | Park et al. | |
| 2022/0238316 A1 | 7/2022 | Lee et al. | |

FOREIGN PATENT DOCUMENTS

| | | |
|---|---|---|
| CN | 114557126 A | 5/2022 |
| JP | 2006352114 A | 12/2006 |
| JP | 2007035886 A | 2/2007 |
| JP | 2010232532 A | 10/2010 |
| JP | 2017216287 A | 12/2017 |
| KR | 20010024966 A | 3/2001 |
| KR | 100845508 B1 | 7/2008 |
| KR | 20110128722 A | 11/2011 |
| KR | 101208700 B1 | 12/2012 |
| KR | 101442633 B1 | 9/2014 |
| KR | 101721921 B1 | 4/2017 |
| KR | 101950439 B1 | 2/2019 |
| KR | 102137719 B1 | 7/2020 |
| KR | 102369346 B1 | 3/2022 |

OTHER PUBLICATIONS

Office Action of CNIPA for Chinese application No. 20231095415.X, issued on Mar. 30, 2024.

* cited by examiner

CERAMIC SUSCEPTOR

CROSS-REFERENCE TO RELATED APPLICATION(S)

This application is based on and claims priority under 35 U.S.C. 119 to Korean Patent Application No. 10-2022-0095402, filed on Aug. 1, 2022, in the Korean Intellectual Property Office, the disclosure of which is herein incorporated by reference in its entirety.

BACKGROUND OF THE INVENTION

1. Field of the Invention

The present disclosure relates to a ceramic susceptor, and more particularly, to a ceramic susceptor having a structure for reducing heat generation in a radio frequency ("RF") electrode.

2. Description of the Prior Art

In general, a semiconductor device or a display device is manufactured by sequentially laminating a plurality of thin film layers including a dielectric layer and a metal layer on a glass substrate, a flexible substrate, a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure chemical vapor deposition (LPCVD) process, a plasma-enhanced CVD (PECVD) process, a metal organic CVD (MOCVD) process, and the like. Ceramic susceptors are disposed in these CVD apparatuses and PVD apparatuses to support glass substrates, flexible substrates, semiconductor wafer substrates, and the like, generate a predetermined level of heat, or generate RF signals for plasma generation. The ceramic susceptors are widely used in accordance with requirements of precise temperature control and heat treatment in plasma deposition processes or the like for precise processes such as miniaturization of wiring lines of semiconductor devices, and are also used for plasma formation or substrate heating in etching processes of thin film layers formed on semiconductor wafer substrates or photoresist firing processes.

As illustrated in FIG. 1, a conventional ceramic susceptor includes an insulating plate 10 coupled to a shaft 20, and the insulating plate 10 includes an RF electrode 12 disposed in a ceramic material. In order to reduce load, the RF electrode 12 is connected to a single rod 29 via parallel RF rods 21 and 23 and a connection member 41 to be connected to an external power supply. Since RF power is increasing for refinement of semiconductor processes and productivity improvement, two separated RF electrode rods 21 and 23 are installed in the shaft 20 to reduce load. This prior art is disclosed in Korean Patent No. 10-2369346 (Feb. 24, 2022).

However, in this conventional structure, since the degrees of thermal expansion, which are respectively applied to the two RF rods 21 and 23, may be different from each other, there is a problem in that a crack or a short circuit occurs in at least one of the two RF rods 21 and 23, resulting in a failure in which power is not normally supplied.

SUMMARY OF THE INVENTION

Therefore, the present disclosure has been made to solve the above-described problems, and the present disclosure provides a ceramic susceptor in which, when two or more RF electrode rods in a shaft are connected in a connection mount, even if there is a difference in thermal expansion between the RF electrode rods, electrical characteristics can be maintained without generating cracks and short-circuit in RF electrode rods by applying a connection member capable of absorbing the difference in thermal expansion.

First, the features of the present disclosure may be summarized as follows. In view of the foregoing, a ceramic susceptor according to an aspect of the present disclosure may include: an insulating plate in which a RF electrode is disposed; a shaft connected to the insulating plate at one end and including a separator at a remaining end; a connection mount having an upper portion connected to the remaining end of the shaft; a first rod and a second rod connected to the RF electrode and penetrating the separator to extend into the connection mount; and a connection member disposed in the connection mount and connecting the first rod and the second rod extending into the connection mount to a draw-in rod, wherein the connection member includes an elastic member configured to absorb a difference in deformation due to heat among the first rod, the second rod, and the draw-in rod.

The elastic member includes: a first fastening portion to which the first rod is fastened; a second fastening portion to which the second rod and the draw-in rod are fastened; and a bent plate between the first fastening portion and the second fastening portion.

The connection member includes: a first coupling member configured to couple the first rod; a second coupling member configured to couple the second rod; and a third coupling member configured to couple the draw-in rod. The elastic member is configured to integrally couple the first coupling member, the second coupling member, and the third coupling member.

The RF electrode may include a first RF electrode and a second RF electrode, the first rod and the first RF electrode may be electrically connected to each other, and the second rod and the second RF electrode may be electrically connected to each other.

The ceramic susceptor may further include a temperature sensor configured to measure a temperature inside the connection mount.

The ceramic susceptor may further include a cooling structure configured to cool the connection mount.

The connection mount may be sealed and may include an inlet and an outlet to circulate a cooling medium, and the draw-in rod may penetrate the sealed connection mount to be exposed to the outside.

The ceramic susceptor may further include a fixing plate configured to fix the draw-in rod, and the draw-in rod may penetrate the fixing plate and the connection mount to be exposed to the outside.

In the ceramic susceptor according to the present disclosure, even if there is a difference in thermal expansion between the RF electrode rods when two or more RF electrode rods in the shaft are connected in the connection mount, the deformation can be absorbed through the elastic member having excellent elasticity and serving as an intermediate member in the connection member. As a result, even if RF power is increased, occurrence of cracks in the RF electrode rods is prevented and the RF electrode rods are prevented from being short-circuited by oxidation. In addition, since arcing or local heat generation is prevented in the high-frequency electrode section, constant electrical characteristics can be maintained, contributing to yield improvement with a stable semiconductor process that does not cause abnormalities in a thin film on a substrate.

BRIEF DESCRIPTION OF THE DRAWINGS

The accompanying drawings, which are included as a part of the detailed description to help the understanding of the present disclosure, provide embodiments of the present disclosure and illustrate the technical spirit of the present disclosure together with the detailed description, in which.

DETAILED DESCRIPTION OF THE EXEMPLARY EMBODIMENTS

Figure 1:
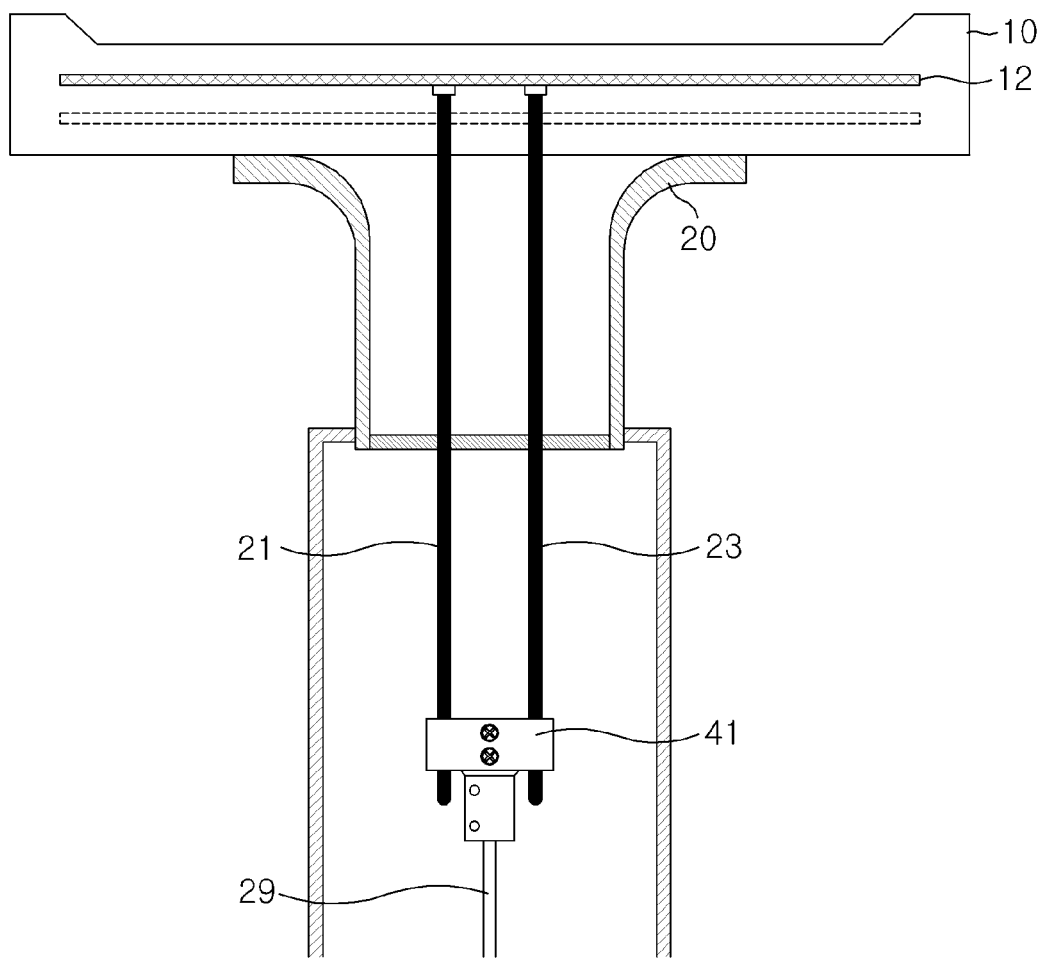
FIG. 1 is a schematic cross-sectional view of a conventional ceramic susceptor.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size, and therefore, the descriptions provided herein are not limited by the relative sizes or spacings of the components drawn in each drawing.

In describing the embodiments of the present disclosure, when it is determined that a detailed description of the known technology related to the present disclosure may unnecessarily obscure the subject matter of the present disclosure, the detailed description will be omitted. In addition, terms to be described later are defined in consideration of functions in the present disclosure and may vary according to the intention, custom, or the like of a user or operator. Therefore, the definitions of the terms should be made based on the description throughout this specification. Terms used in the detailed description are only for describing the embodiments of the present disclosure, and should not be treated as limiting. Unless expressly used otherwise, a singular form of expression includes meaning of a plural form. In this description, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof.

In addition, terms such as "first" and "second" may be used to describe various components, but the components are not limited by the terms, and these terms are only used for the purpose of distinguishing one component from another.

Figure 2:
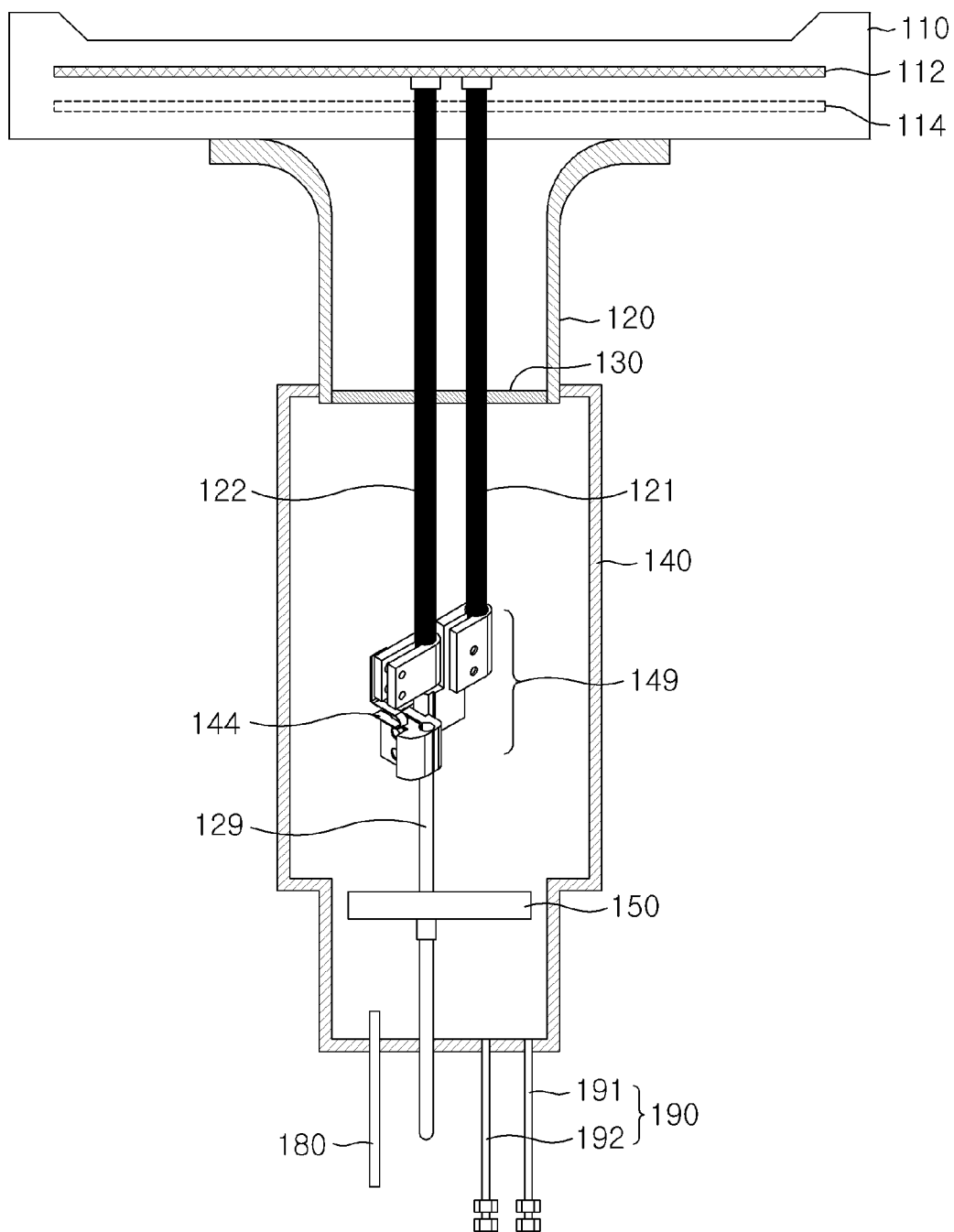
FIG. 2 is a schematic cross-sectional view of a ceramic susceptor according to an embodiment of the present disclosure.

FIG. 2 is a schematic cross-sectional view of a ceramic susceptor 100 according to an embodiment of the present disclosure.

Referring to FIG. 2, the ceramic susceptor 100 according to an embodiment of the present disclosure includes an insulating plate 110, a shaft 120, and a connection mount 140. The insulating plate 110, the shaft 120, and the connection mount 140 are sequentially connected to each other, and a separator 130, which is provided at a longitudinal end of the shaft 120, is included between the shaft 120 and the connection mount 140 to isolate the inner space therebetween.

The ceramic susceptor 100 according to an embodiment of the present disclosure may be a semiconductor apparatus configured to support a substrate to be processed for various purposes, such as a semiconductor wafer, a glass substrate, or a flexible substrate, and to heat the substrate to be processed to a predetermined temperature. In addition, the ceramic susceptor 100 may include a chuck electrode to support an electrostatic chuck function, and may further include a heating element to support a heater function or an RF electrode to support a process, such as plasma-enhanced chemical vapor deposition.

The insulating plate 110 may be configured such that the RF electrode 112 is disposed (embedded) between ceramic materials, and in some cases, may be further configured such that the heating element 114 is disposed (embedded) to be spaced apart from the RF electrode 112 by a predetermined distance. The insulating plate 110 is configured to be capable of heating a substrate to be processed by using the heating element 114 while stably supporting the substrate to be processed and/or to be capable of performing various semiconductor processes, such as plasma-enhanced chemical vapor deposition process, by using the RF electrode 112. In addition, the ceramic susceptor 100 according to an embodiment of the present disclosure may be used as an electrostatic chuck for chucking and dechucking a substrate to be processed by using a predetermined chuck electrode. The insulating plate 110 may be a plate-like structure having a predetermined shape. For example, the insulating plate 110 may be a circular plate-like structure, but is not necessarily limited thereto. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered together with the above-described electrodes to provide the insulating plate 110, and each ceramic powder for this purpose may optionally contain about 0.1 to 10%, preferably about 1 to 5% of yttrium oxide powder.

The RF electrode 112 may be made of tungsten (W), molybdenum (Mo), silver (Ag), gold (Au), niobium (Nb), titanium (Ti), aluminum nitride (AlN), or an alloy thereof, preferably molybdenum (Mo). The RF electrode 112 may be connected to a power source (e.g., ground line) via a draw-in rod 129 connected to a connection member 149 that interconnects (shorts) the connection rods 121 and 122. The connection rods 121 and 122 are disposed to penetrate the inside of the shaft 120 and the separator 130. Hereinafter, the number of connection rods 121 and 122 will be described as two as an example, but may be three or more in some cases.

The connection mount 140 is connected to the longitudinal end of the shaft 120, the connection rods 121 and 122, which penetrate the separator 130 provided at the longitudinal end portion of the shaft 120, are connected to each other by the connection member 149, which is disposed in the inside of the sealed connection mount 140, and the draw-in rod 129 connected to the connection member 149 extends through the lower portion of the connection mount 140 and extends outward. The RF electrode 112 has a wire type or sheet type mesh structure. Here, the mesh structure is a structure in the form of a mesh fabricated by making a plurality of metals arranged in a first direction and a plurality of metals arranged in a second direction cross relative to each other in an alternating manner.

The heating element 114 may be fabricated in a plate-shaped coil shape or a flat plate shape with a heating wire (or a resistance wire). In addition, the heating element 114 may be fabricated in a multi-layer structure for precise temperature control. The heating element 114 is connected to a power supply for the heating element via a heating element connection rod (not illustrated), and may execute a function of heating a substrate to be processed on the insulating plate 110 to a predetermined constant temperature in order to perform processes, such as substrate heating, deposition, and etching, in a semiconductor process. Although not illustrated in FIG. 2, the heating element connection rod may be disposed to penetrate the inside of the shaft 120 and the separator 130. The heating element connection rod penetrating the separator 130 may penetrate the lower portion of the sealed connection mount 140 and extend to the outside.

The shaft 120 has a pipe shape having a through hole and is coupled to the bottom surface of the insulating plate 110. The shaft 120 may be made of the same ceramic material as the insulating plate 110 and coupled to the same. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered to provide the shaft 120, and each ceramic powder for this purpose may optionally contain about 0.1 to 10%, preferably about 1 to 5% of yttrium oxide powder.

The shaft 120 may be coupled to the insulating plate 110 with a bonding material such as ceramic paste as described below. In some cases, the shaft 120 may be mechanically coupled to the insulating plate 110 by using bolts, nuts, and the like. The rods 121 and 122 that supply power to the RF electrode 112 and/or the heating element 114 are respectively accommodated through the through holes in the shaft 120 and penetrate the sealed connection mount 140 to extend to the outside.

In the ceramic susceptor 100 according to an embodiment of the present disclosure, in particular, two or more connection rods 121 and 122 in the shaft 120 connected to the RF electrode 112 are connected inside the sealed connection mount 140 having a cooling structure (including an inlet 191 and an outlet 192 for circulation of a cooling medium). As a result, even if the RF power is increased, there is no cracking and no arcing around the RF electrode 112 and the rods 121 and 122 connected to the RF electrode 112 since the current is distributed into the two or more connection rods 121 and 122, and it is possible to uniformize film formation characteristics on the substrate by heat generation, and to maintain electrical characteristics without occurrence of a short circuit due to oxidation of the rods 121 and 122 connected to the RF electrode 112. In particular, even if there is a difference in thermal expansion between the RF electrode rods, since the connection member 149 is configured to be capable of absorbing the deformation via an elastic member 144 as an intermediate member having excellent elasticity, so that occurrence of cracks in the high-frequency electrode rods 121 and 122 and occurrence of a short circuit caused by oxidation can be prevented even if the RF power is increased. Since arcing or local heat generation is prevented in the high-frequency electrode section including the high-frequency electrode 112 and the electrode rods 121 and 122, constant electrical characteristics can be maintained, contributing to yield improvement with a stable semiconductor process that does not cause abnormalities in a thin film on a substrate.

In addition, in the present disclosure, because the connection mount 140 keeps cool, the inside thereof is not exposed to a high temperature unlike the inside of a conventional shaft, and because the connection rods 121 and 122 and the connection member 149 are located inside the connection mount 140, the connection rods and the connection member are not easily oxidized and are able to maintain electrical characteristics without being oxidized and short-circuited due to the cooling of the inside of the connection mount 140. In the prior art, it was not easy to connect RF electrode rods in a hole having a small diameter in the shaft. However, in the present disclosure, because the connection member 149 is provided in the connection mount 140 rather than being located in the shaft 120, an operation of connecting the connection rods 121 and 122 via the connection member 149 may be performed more easily than in the prior art structure.

As illustrated in FIG. 2, the present disclosure discloses a configuration in which a plurality of connection rods 121 and 122 connected to a single RF electrode 112 are connected to each other by the connection member 149 inside the connection mount 140. However, the present disclosure is not limited thereto, and in some cases, the RF electrode 112 may include two or more separate electrodes (e.g., two separate electrodes including a first RF electrode and a second RF electrode). In this case, a configuration in which the plurality of connection rods are electrically connected to the plurality of separate electrodes, respectively, is possible. Here, in the former case in which a plurality of connection rods are connected to a single RF electrode 112, by minimizing the size of the through holes formed in the insulating plate 110 to connect the connection rods 121 and 122 to the terminals of the RF electrode 112, it is possible to obtain an advantageous structure that prevents cracks from occurring due to a difference in thermal expansion coefficients between the connection rods 121 and 122 and the insulating plate 110.

As illustrated in FIG. 2, the connection mount 140 is connected to the longitudinal end of the shaft 120. The connection mount 140 may be mechanically coupled to the shaft 120 with the separator 130 in the state in which the separator 130, which is provided at the end of the shaft 120 in the longitudinal direction, is interposed therebetween. The connection between the shaft 120 and the separator 130 may be achieved through mechanical coupling using bolts, nuts, and the like. In addition, the connection between the separator 130 coupled to the shaft 120 and the upper portion of the connection mount 140 may be achieved through mechanical coupling using bolts, nuts, and the like. The peripheries of the through-holes in the separator 130 for the connection rods 121 and 122 penetrating the separator 130 are sealed with the above-described ceramic paste, or the like without gaps, and the upper portion of the connection mount 140 is fastened to surround the periphery of the separator 130. The space between the upper portion of the connection mount 140 and the separator 130 may also be sealed with the above-described ceramic paste or the like without gaps.

In the bottom surface of the connection mount 140 as well, the peripheries of the through-holes through which the draw-in rod 129 and the temperature sensor 180 pass are sealed with the above-described ceramic paste or the like without gaps. The bottom surface of the connection mount 140 may be integrally manufactured with the wall surface of the body of the connection mount 140 as illustrated in FIG. 2, but is not limited thereto. It is also possible to mechanically couple a separate bottom surface plate to the wall surface of the body of the connection mount 140 by using bolts, nuts, and the like, and to seal the connection mount 140.

As illustrated in FIG. 2, the connection rods 121 and 122 connected to the RF electrode 112 extend from the inside of the shaft 120 into the connection mount 140 through the longitudinal end of the shaft 120. That is, the connection rods 121 and 122 are disposed to penetrate the separator 130 provided at the longitudinal end of the shaft 120. Two connection rods 121 and 122 penetrating the separator 130 are separated from each other and connected (short-circuited) to each other by a connection member 149 disposed inside the sealed connection mount 140 and having an elastic member 143, and the draw-in rod 129 connected to the connection member 149 penetrates the lower portion of the connection mount 140 and extends to the outside. The draw-in rod 129 may be connected to a power supply (e.g., ground line) so that the RF electrode 112 forms one electrode of the RF power supply.

Figure 3:
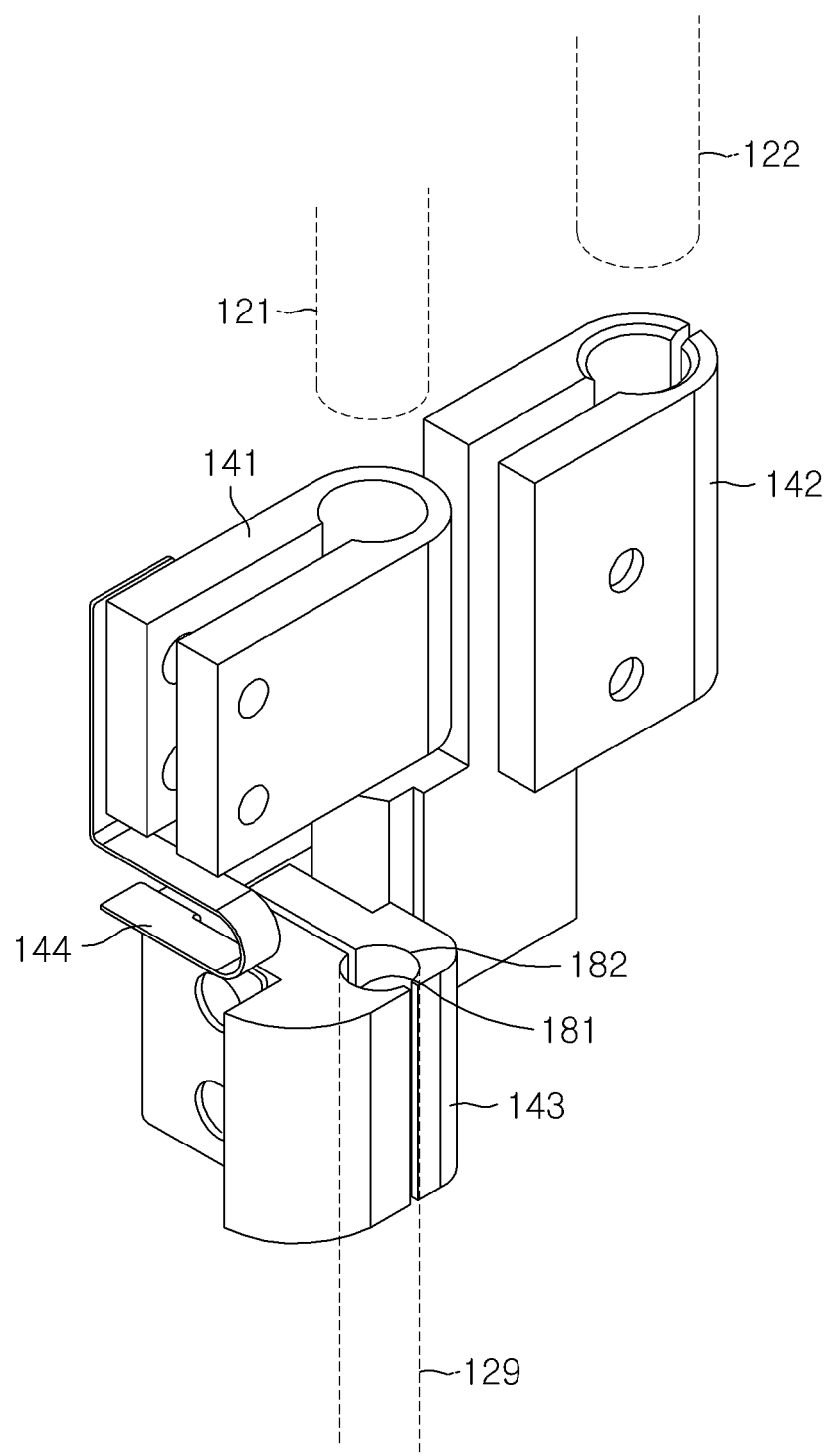
FIG. 3 is a schematic perspective view of the connection member according to an embodiment of the present disclosure when viewed from the right side.

FIG. 3 is a schematic perspective view of the connection member 149 according to an embodiment of the present disclosure when viewed from the right side.

Figure 4:
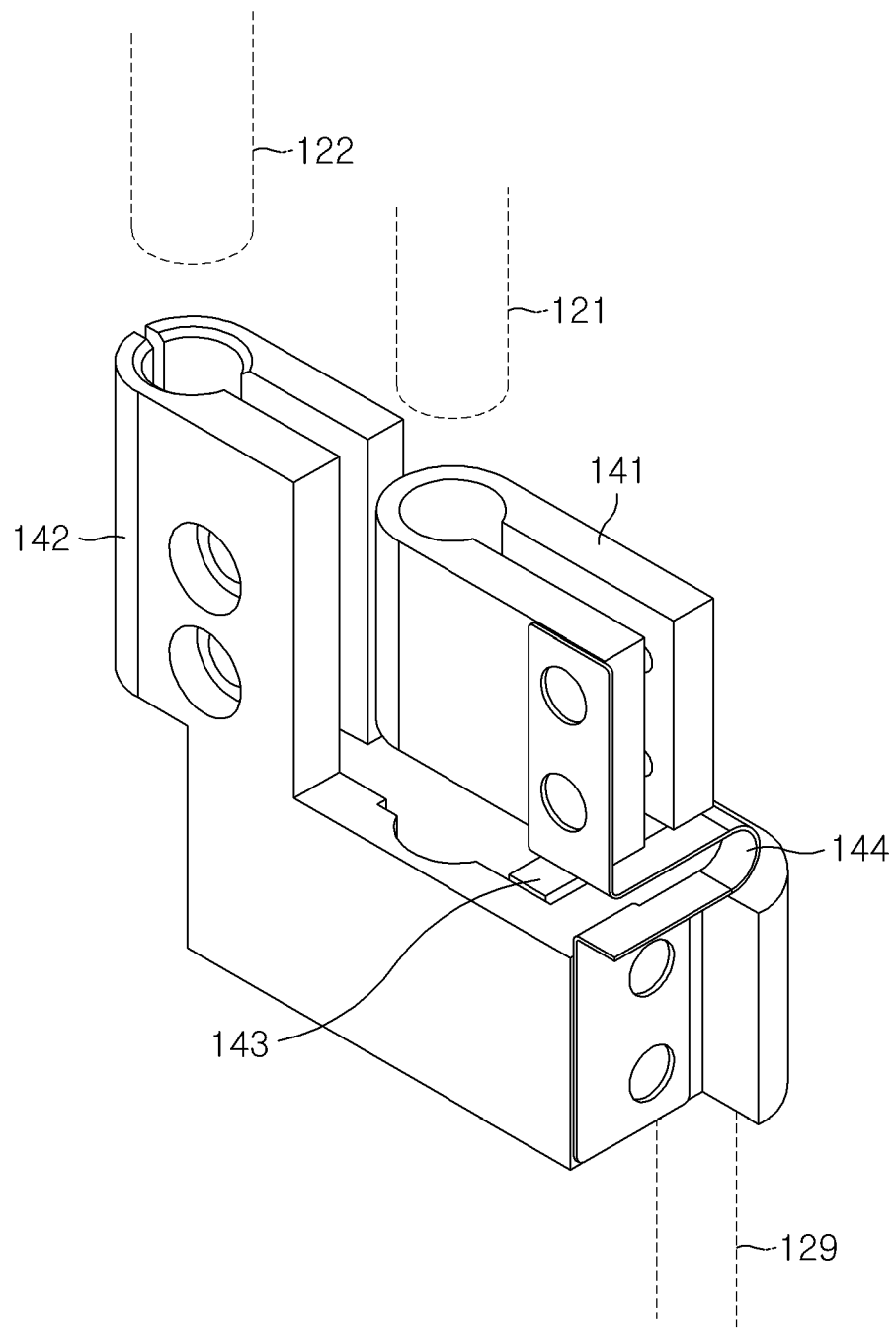
FIG. 4 is a schematic perspective view of the connection member according to an embodiment of the present disclosure when viewed from the left side.

FIG. 4 is a schematic perspective view of the connection member 149 according to an embodiment of the present disclosure when viewed from the left side.

Figure 5:
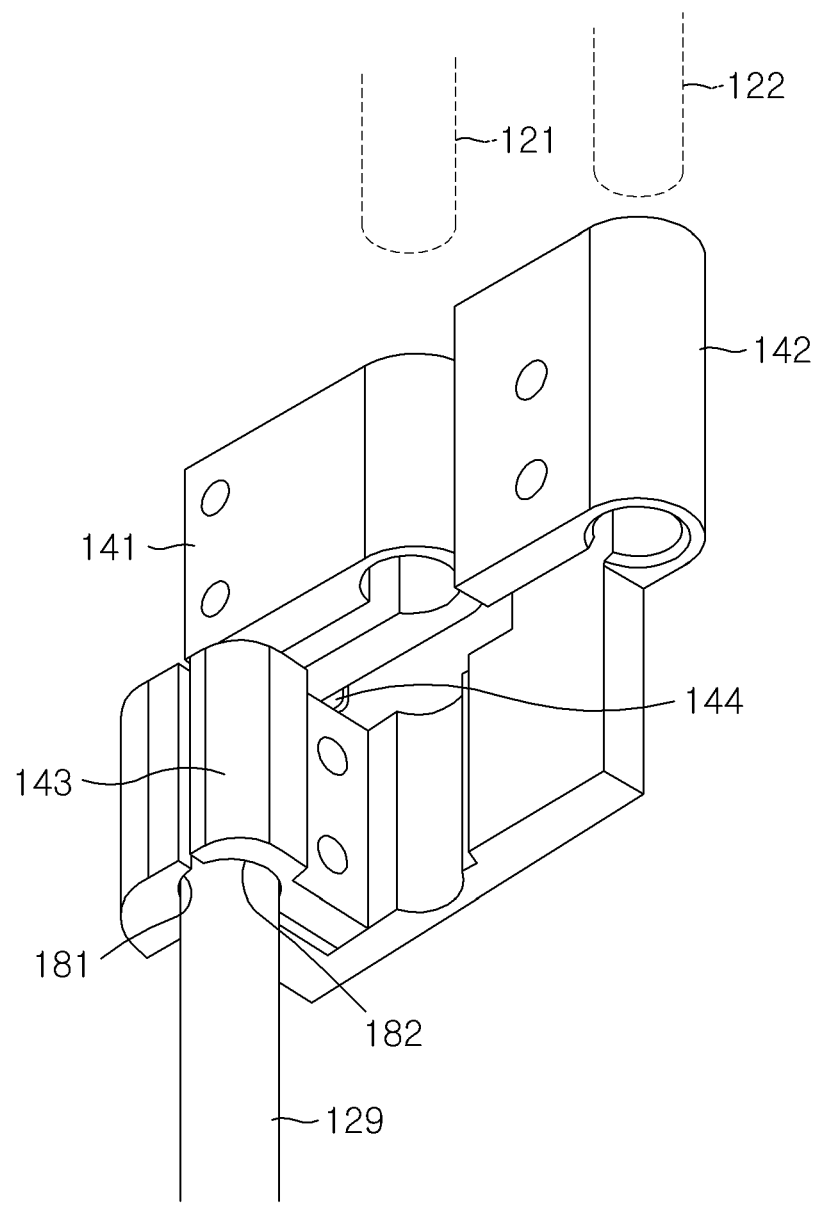
FIG. 5 is a schematic perspective view of the connection member according to an embodiment of the present disclosure when viewed from the lower right side.

FIG. 5 is a schematic perspective view of the connection member 149 according to an embodiment of the present disclosure when viewed from the lower right side.

Figure 6:
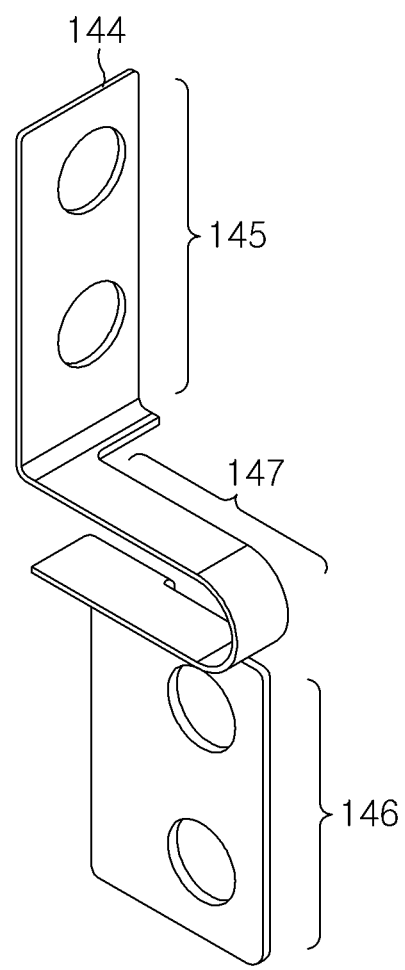
FIG. 6 is a schematic perspective view of an elastic member according to an embodiment of the present disclosure.

FIG. 6 is a schematic perspective view of an elastic member 143 according to an embodiment of the present disclosure.

Referring to FIGS. 3 to 6, the connection member 149 includes a first coupling member 141 for coupling a first connection rod 121, a second coupling member 142 for coupling a second connection rod 122, and a third coupling member 143 for coupling a draw-in rod 129, and includes an elastic member 144 that integrally couples the first coupling member 141, the second coupling member 142, and the third coupling member 143.

As illustrated in FIG. 6, the elastic member 144 includes a first fastening portion 145 to which the first connection rod 121 is fastened, a second fastening portion to which the second connection rod 122 and the draw-in rod 129 are coupled, and a bent plate 147 between the first fastening portion 145 and the second fastening portion 146.

The elastic member 144 is for absorbing a difference in deformation due to heat among the first connection rod 121, the second connection rod 122, and the draw-in rod 129. That is, when the first connection rod 121, the second connection rod 122, and the draw-in rod 129 are integrally coupled with the first coupling member 141, the second coupling member 142, and the third coupling member 143, even if a temperature difference occurs among the first connection rod 121, the second connection rod 122 and the draw-in rod 129 during various semiconductor processes, such as plasma-enhanced chemical vapor deposition process described above, and there is a difference in the degree of deformation among respective rods, the flexible bent plate 147 is able to flexibly adsorb the difference in deformation.

To this end, each of the above components of the connection member 149 may be made of a metal material having excellent electrical conductivity, such as Cu, BeCu, Au, Ag, or a metal obtained by coating Cu or BeCu with Au. In the elastic member 144, the first fastening portion 145, the second fastening portion 146, and the bent plate 147 may be integrally configured, and the bent plate 147 may have a smaller thickness than the first fastening portion 145 and the second fastening portion 146 for flexibility.

One or more screw holes may be provided in the first fastening portion 145 and the second fastening portion 146 of the elastic member 144. It is possible to fix the first connection rod 121, one end portion of which is inserted into an insertion hole on one side of the coupling member 141, by tightening plates of the first coupling member 141, which face to each other with an open space interposed therebetween, via the threads of the screw holes or nuts on the opposite side, by means of screws fastened to the screw holes in the first fastening portion 145 and the corresponding screw holes in the first coupling member 141.

In addition, the second coupling member 142 includes, on one side of an L-shaped body, an insertion hole and one or more screw holes for coupling the second connection rod 122 and includes, on the other side, one or more screw holes for coupling the third coupling member 143, the draw-in rod 129, and the second fastening portion 146. That is, it is possible to fix the second connection rod 122 by inserting an end portion of the connection rod 122 into the insertion hole on one side of the second coupling member 142, and by tightening the plates of the second coupling member 142, which face each other with an open space interposed therebetween, via the screw threads of the screw holes or the nuts on the opposite side, by means of the screws fastened to the corresponding screw holes.

In addition, in order to couple the third coupling member 143, the draw-in rod 129, and the second fastening portion 146 on the other side of the L-shaped body of the second coupling member 142, the screw holes of the second coupling portion 146 on one side and the screw holes of the third coupling member 143 on the other side are provided to correspond to the screw holes of the second coupling member 142. While the third coupling member 143 and the second fastening portion 146 are tightly coupled to each other with the body of the second coupling member 142 being sandwiched therebetween, via the screw threads of the screw holes or nuts on the opposite side, by means of the screws fastened to the corresponding screw holes of the three members, the draw-in rod 129 inserted between a groove 181 formed at an end side of the second coupling member 142 and a groove 182 formed at an end side of the third coupling member 143 can be fixed.

As described above, two connection rods 121 and 122 penetrating the separator 130 and connected to the RF electrode 112 are separated from each other and are connected (short-circuited) to each other by the connection member 149 disposed inside the connection mount 140, and the draw-in rod 129 connected to the connection member 149 penetrates the bottom surface of the sealed connection mount 140 and extends to the outside.

On the other hand, in FIG. 2, the ceramic susceptor 100 according to the present disclosure may further include a temperature sensor 180 (e.g., a thermocouple) configured to measure the temperature inside the connection mount 140, and the connection mount 140 may include a cooling structure 190 configured to cool the connection mount 140.

The cooling structure 190 includes an inlet 191 and an outlet 192 for circulation of a cooling medium, such as air, water, gas, or cooling oil. The cooling structure 190 may include a predetermined motor pump (not illustrated) to introduce the cooling medium into the connection mount 140 through the inlet 191 and to discharge the cooling medium from the connection mount 140 through the outlet 192.

In addition, the temperature sensor 180 may be connected to a control device (not illustrated) such as a computer, and the temperature inside the connection mount 140 may be monitored via a display screen of the control device (not illustrated).

Furthermore, the control device (not illustrated) may control the operation of the pump (not illustration) depending on a temperature value measured by the temperature sensor 180. For example, when the temperature value measured by the temperature sensor 180 is greater than or equal to a threshold (e.g., 80° C.), the control device (not illustrated) may operate the pump (not illustrated) connected to the inlet 191 and the outlet 192 to cool the connection mount 140, and when the temperature value measured by the temperature sensor 180 is smaller than the threshold (e.g., 80° C.), the control device may control the pump (not illustrated) to stop the operation.

In addition, as illustrated in FIG. 2, the connection mount 140 of the ceramic susceptor 100 according to the present disclosure may further include a fixing plate 150 configured to fix the draw-in rod 129 or other connection rods.

That is, the draw-in rod and one or more rods connected to the heating element 114 and disposed to penetrate the inside of the shaft 120 and the separator 130 are fixed once again by the fixing plate 150, enabling assurance of safety, such as prevention of short-circuit caused by shaking. The draw-in rod 129 and one or more rods connected to the heating element 114 and disposed to penetrate the inside of the shaft 120 and the separator 130 penetrate the fixing plate 150 and the bottom surface of the connection mount 140 to be exposed to the outside.

The above-described connection mount 140, separator 130, fixing plate 150, and the like may be made of a metal material, such as aluminum (Al), or may be made of a ceramic material described above. The ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered to provide the shaft 120, and each ceramic powder for this purpose may optionally contain about 0.1 to 10%, preferably about 1 to 5% of yttrium oxide powder.

In addition, both the above-described connection rods 121 and 122 and a conductor of an inner core of the draw-in rod 129 may each be covered with a ceramic tube described above. That is, it is preferable to cover each of the connection rods 121 and 122 inside the shaft 120 with a ceramic tube as described above. In addition, portions of the connection rods that are exposed after penetrating the separator 130, the fixing plate 150, and the bottom surface of the connection mount 140, and portions of the connection rods 121 and 122 that extend up to the connection member 149 after penetrating the separator 130 may each be covered with a ceramic tube as described above. Furthermore, the portion of the draw-in rod 129 that is exposed after extending from the connection member 149 and penetrating the fixing plate 150 and the bottom surface of the connection mount 140 may be covered with a ceramic tube as described above.

As described above, in the ceramic susceptor 100 according to the present disclosure, even if there is a difference in thermal expansion between the RF electrode rods 121 and 122 when two or more RF electrode rods 121 and 122 in the shaft are connected in the connection mount 140, the deformation can be absorbed through the elastic member 143 having excellent elasticity and serving as an intermediate member in the connection member 149. As a result, even if RF power is increased, occurrence of cracks in the RF electrode rods 121 and 122 is prevented and the RF electrode rods are prevented from being short-circuited by oxidation. Since arcing or local heat generation is prevented in the high-frequency electrode section, constant electrical characteristics can be maintained, contributing to yield improvement with a stable semiconductor process that does not cause abnormalities in a thin film on a substrate.

As described above, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas equivalent to or equivalently modified to the claims should be interpreted as being included in the scope of the present disclosure.

What is claimed is:

1. A ceramic susceptor comprising:
   an insulating plate in which a RF electrode is disposed;
   a shaft connected to the insulating plate at one end and comprising a separator at a remaining end;
   a connection mount having an upper portion connected to the remaining end of the shaft;
   a first rod and a second rod connected to the RF electrode and penetrating the separator to extend into the connection mount; and
   a connection member disposed in the connection mount and connecting the first rod and the second rod extending into the connection mount to a draw-in rod,
   wherein the connection member comprises:
   a first coupling member configured to couple the first rod;
   a second coupling member configured to couple the second rod;
   a third coupling member configured to couple the draw-in rod; and
   an elastic member, and
   wherein the first, second, and third coupling members formed separately from each other form one body with the elastic member through each coupling with the elastic member.

2. The ceramic susceptor of claim 1, wherein the elastic member comprises:
   a first fastening portion to which the first rod is fastened;
   a second fastening portion to which the second rod and the draw-in rod are fastened; and
   a bent plate between the first fastening portion and the second fastening portion.

3. The ceramic susceptor of claim 1, wherein the RF electrode comprises a first RF electrode and a second RF electrode, and the first rod and the first RF electrode are electrically connected to each other, and the second rod and the second RF electrode are electrically connected to each other.

4. The ceramic susceptor of claim 1, further comprising a temperature sensor configured to measure a temperature inside the connection mount.

5. The ceramic susceptor of claim 1, further comprising a cooling structure configured to cool the connection mount.

6. The ceramic susceptor of claim 1, wherein the connection mount is sealed and comprises an inlet and an outlet to circulate a cooling medium, and the draw-in rod penetrates the sealed connection mount to be exposed to outside.

7. The ceramic susceptor of claim 1, further comprising a fixing plate configured to fix the draw-in rod, wherein the draw-in rod penetrates the fixing plate and the connection mount to be exposed to outside.

* * * * *